(12) United States Patent  
Han

(10) Patent No.: US 11,999,612 B2  
(45) Date of Patent: Jun. 4, 2024

(54) OPTICAL MEMS BASED MONITORING SYSTEM

(71) Applicant: Naiqian Han, Riverside, CA (US)

(72) Inventor: Naiqian Han, Riverside, CA (US)

( * ) Notice: Subject to any disclaimer, the term of this patent is extended or adjusted under 35 U.S.C. 154(b) by 172 days.

(21) Appl. No.: 17/525,950

(22) Filed: Nov. 14, 2021

(65) Prior Publication Data

US 2022/0155147 A1 May 19, 2022

Related U.S. Application Data

(60) Provisional application No. 63/113,882, filed on Nov. 15, 2020, provisional application No. 63/113,883, filed on Nov. 15, 2020.

(51) Int. Cl.
*B81B 3/00* (2006.01)
*G01J 3/02* (2006.01)
(Continued)

(52) U.S. Cl.
CPC .......... *B81B 3/0021* (2013.01); *B81B 3/0024* (2013.01); *G01J 3/021* (2013.01);
(Continued)

(58) Field of Classification Search
CPC ................ B81B 3/0021; B81B 3/0024; B81B 2201/0264; B81B 2201/0271;
(Continued)

(56) References Cited

U.S. PATENT DOCUMENTS 6,218,661 B1 * 4/2001 Schroeder .......... G01D 5/35316
250/227.14

2006/0109470 A1 * 5/2006 May ...................... G01K 11/12
356/437
(Continued)

FOREIGN PATENT DOCUMENTS

| CN | 203551100 U | * | 4/2014 | |
| CN | 103885177 A | * | 6/2014 | |
| WO | WO-2019149815 A1 | * | 8/2019 | ............. G01N 21/39 |

OTHER PUBLICATIONS

International Search Report and written opinion of PCT Patent Application No. PCT/US2021/059042 dated Feb. 4, 2022.
(Continued)

*Primary Examiner* — Tarifur R Chowdhury
*Assistant Examiner* — Akbar H. Rizvi

(57) ABSTRACT

Provided is an optical micro-electro-mechanical system (MEMS) based monitoring system, comprising: a broadband light source, a tunable optical filter (TOF), an optical etalon, a plurality of optical receivers, a plurality of optical couplers, and a plurality of optical MEM sensors; the TOF is configured to capture a transmission, reflection or interference spectrum of the optical MEMS sensors; wherein the peak or depression wavelength in the transmission, reflection or interference spectrum corresponds to a parameter of the pressure, temperature or stress, and the peak or depression wavelength can be obtained by comparing the spectrum with the periodic spectrum of the optical etalon, the optical etalon has an absolute wavelength mark; and the optical MEMS sensor comprises an optical MEMS resonator. The parameter of the pressure, temperature or stress can be obtained by the peak or depression wavelength in the transmission, the reflection or the interference spectrum of the optical MEMS sensor.

16 Claims, 8 Drawing Sheets

(51) Int. Cl.
  *G01J 3/10*   (2006.01)
  *G01J 3/45*   (2006.01)
  *G02B 27/30*  (2006.01)

(52) U.S. Cl.
  CPC ............... *G01J 3/0218* (2013.01); *G01J 3/10* (2013.01); *G01J 3/45* (2013.01); *B81B 2201/0264* (2013.01); *B81B 2201/0271* (2013.01); *B81B 2201/0278* (2013.01); *B81B 2201/047* (2013.01); *G02B 27/30* (2013.01)

(58) Field of Classification Search
  CPC ....... B81B 2201/0278; B81B 2201/047; G01J 3/021; G01J 3/0218; G01J 3/10; G01J 3/45; G02B 27/30; G02B 5/1828; G02B 5/1861
  See application file for complete search history.

(56) References Cited

U.S. PATENT DOCUMENTS

| | | | |
|---|---|---|---|
| 2008/0106745 A1* | 5/2008 | Haber | G01B 11/18 356/519 |
| 2012/0050735 A1 | 3/2012 | Higgins et al. | |
| 2013/0324858 A1* | 12/2013 | Xu | A61B 5/0068 600/478 |
| 2015/0309306 A1* | 10/2015 | Murarka | B81C 1/00634 359/295 |
| 2016/0085066 A1* | 3/2016 | Graves | G02B 6/3556 250/203.2 |
| 2016/0103017 A1* | 4/2016 | Hung | G01J 3/42 250/227.11 |
| 2016/0262627 A1 | 9/2016 | Hecker et al. | |
| 2016/0380404 A1 | 12/2016 | Bulovic et al. | |
| 2017/0328702 A1* | 11/2017 | Vossough | G01P 15/093 |
| 2018/0086628 A1* | 3/2018 | Vossough | G01L 19/0007 |
| 2018/0317022 A1* | 11/2018 | Evans | G01L 19/0092 |
| 2018/0321085 A1* | 11/2018 | Gruca | G01L 1/242 |
| 2019/0006157 A1 | 1/2019 | O'Banion et al. | |
| 2019/0293923 A1 | 9/2019 | Ghahremani et al. | |
| 2020/0041728 A1 | 2/2020 | Spector et al. | |
| 2020/0049891 A1* | 2/2020 | Menard | H01S 5/021 |

OTHER PUBLICATIONS

International Search Report and written opinion of PCT Patent Application No. PCT/US2021/059299 dated Feb. 9, 2022.

* cited by examiner

OPTICAL MEMS BASED MONITORING SYSTEM

CROSS-REFERENCE TO RELATED APPLICATION

This application claims priority date of U.S. Provisional Patent Application No. 63/113,882, filed Nov. 15, 2020, and U.S. Provisional Patent Application No. 63/113,883, filed Nov. 15, 2020, by the Applicants of this Formal Patent Application. The contents of which are herein incorporated by reference in their entireties.

TECHNICAL FIELD

The present application relates to the monitoring field, in particular to an optical MEMS based monitoring system.

BACKGROUND

Monitoring systems are widely applied all over the world. They can sense the pressure, the temperature or the stress which are required in many industries. This application relates generally to an optical MEMS based monitoring system and its sensors. The advantage of the optical monitoring system is its high sensitivity and anti-electromagnetic interference which is suitable for harsh environments.

DESCRIPTION OF THE RELATED ART

There are several major disadvantages for the existing monitoring systems in the market.

The disadvantage of an electric-platform-based system is that the electric wire is easily interfered with electromagnetic waves. A shielded wire has to be employed to eliminate electromagnetic interference. However, the shielded wire has to be with a large diameter, which is not suitable for invasive medical devices requiring thin wires to avoid serious damage to human body. The unshielded thin wires will be interfered with tiny electromagnetic waves generated by the human muscle or neuron.

Some equipment can generate an extremely large electromagnetic field which can intrude all kinds of shielded wire and cause electromagnetic damage to electric-platform-based monitoring system. For example, the electric-platform-based pressure monitor will be interfered with the strong electromagnetic waves generated from a giant drilling equipment. The electric-platform-based sensor under MRI (Magnetic Resonance Imaging) may be burned out by the powerful electromagnetic waves.

An invasive medical device requires one wire can support multiple sensors with different monitoring functions to minimize the human tissue wound. But, in the electrical-platform-based monitoring system, one wire can only support one sensor. Many sensors need the same number of wires which causes a big human tissue wound.

Due to the disadvantages, the electric-platform-based monitoring system and sensors are restricted in many applications.

Optical-platform-based monitoring systems and their sensors are not interfered with electromagnetic waves. However, most optical systems employ optical intensity as the sensing reference which is not ideal methodology. In these systems, one optical fiber can only support one sensor and the optical attenuation due to the optical fiber bending may misjudge the sensing parameter.

More and more optical systems employ optical wavelength as the sensing reference. In these ideal optical systems, one optical fiber can support multiple sensors by wavelength-multiplex technology and the system can monitor a parameter precisely without being affected by the optical attenuation. However, the fiber Bragg gratings are normally employed as sensors in these ideal optical systems, which have the disadvantages of large size, complex assembly process and poor performance.

The optical etalon is a key component in the ideal optical system. The current etalon applying the periodic transmission spectrum with an absolute wavelength mark is coupled by two single mode optical fiber collimators, whose shortcomings are too big in size and thermally unstable.

The TOF is another key component in the monitoring system. The MEMS TOF has better optical performances than all other solutions. However, since the MEMS mirror is applied as a tuning element in MEMS TOF, it has the shortcoming of low tuning speed and has to be abandoned in fast sensing applications.

In this application, the optical MEMS technology is employed to design the optical components, the sensors and the new system control methodology, so that none of the shortcomings above exists in this new platform.

SUMMARY

To solve the above problem, the disclosure provides an optical MEMS based monitoring system, comprising: a broadband light source, a TOF, an optical etalon, a plurality of optical receivers, a plurality of optical couplers, and a plurality of optical MEM sensors; the TOF is configured to capture a spectrum of the optical MEMS sensor, wherein the spectrum is selected from one of a transmission spectrum, a reflection spectrum and an interference spectrum; wherein a peak or depression wavelength in a spectrum corresponds to a parameter to be monitored of a pressure, a temperature or a stress; and the peak or depression wavelength can be obtained by comparing the spectrum with a periodic spectrum of the optical etalon, and the optical etalon has an absolute wavelength mark; and the optical MEMS sensor comprises an optical MEMS resonator.

In the above optical MEMS based monitoring system, the peak or depression wavelength is a function of the parameter of the pressure, the temperature or the stress, and the function is concluded in advance, so that the system can monitor the parameter according to the peak or depression wavelength in the transmission, the reflection or the interference spectrum of the optical MEMS sensor.

In the above optical MEMS based monitoring system, the MEMS membrane deforms slightly due to the parameter of the pressure, the temperature or the stress to be monitored, so that the peak or depression wavelength in the transmission, the reflection or the interference spectrum of the optical MEMS sensor changes, accordingly.

In the above optical MEMS based monitoring system, the combination of the broadband light source and the TOF can be replaced by a tunable laser, configured for wavelength scanning.

In the above optical MEMS based monitoring system, the tunable laser comprises the TOF, an erbium-doped fiber amplifier, a pump laser and a plurality of optical couplers.

In the above optical MEMS based monitoring system, the optical MEMS sensor is an optical pigtail MEMS sensor, comprising a single mode optical fiber, a MEMS membrane and a glass tube; the optical MEMS resonator is formed by the tip of the single mode optical fiber and the MEMS membrane; the glass tube is configured to support the single mode optical fiber and the MEMS membrane; and the cavity of the optical MEMS resonator is sealed or provided with an air hole.

In the above optical pigtail MEMS sensor, the single mode optical fiber can be replaced by a single mode optical lensed fiber.

In the above optical MEMS based monitoring system, the optical MEMS sensor is an optical collimator MEMS sensor, comprising a single mode optical fiber collimator, a MEMS membrane and a glass tube; the optical MEMS resonator is formed by the lens plane of the single mode optical fiber collimator and the MEMS membrane; the glass tube is configured to support the single mode optical fiber collimator and the MEMS membrane; and the cavity of the optical MEMS resonator is sealed or provided with an air hole.

In the above optical collimator MEMS sensor, the single mode optical fiber collimator can be replaced by a single mode optical dual fiber collimator.

In the above optical collimator MEMS sensor, the single mode optical fiber collimator can be replaced by a single mode optical lensed fiber.

In the above optical MEMS based monitoring system, the optical MEMS sensor is an optical collimator MEMS sensor, comprising a single mode optical fiber collimator, two MEMS membranes and a glass tube; the optical MEMS resonator is formed by the two MEMS membranes; the glass tube is configured to support the single mode optical fiber collimator and the MEMS resonator; and the cavity of the optical MEMS resonator is sealed or provided with an air hole.

In the above optical MEMS based monitoring system, the optical MEMS sensor is an optical isolated MEMS sensor, comprising a glass mirror, a MEMS membrane and a glass tube; the optical MEMS resonator is formed by the glass mirror and the MEMS membrane; the glass tube is configured to support the glass mirror and the MEMS membrane; and the cavity of the optical MEMS resonator is sealed or provided with an air hole.

In the above optical isolated MEMS sensor, the isolated optical MEMS sensor further comprises a trigonometric reflector, the trigonometric reflector is configured to reflect an input light beam back, so that the input light beam passes the optical MEMS resonator twice.

In the above optical MEMS based monitoring system, the optical MEMS sensor is an optical isolated MEMS sensor, comprising two MEMS membranes and a glass tube; the optical MEMS resonator is formed by the two MEMS membranes; the glass tube is configured to support the glass mirror and the MEMS resonator; and the cavity of the optical MEMS resonator is sealed or provided with an air hole.

In the above optical MEMS based monitoring system, a plurality of fiber Bragg gratings are employed with the optical MEMS sensors.

In the above optical MEMS based monitoring system, the optical MEMS sensors and the fiber Bragg gratings are connected by series or parallel.

In the above optical MEMS based monitoring system, the optical etalon comprises a single mode optical dual fiber collimator, an optical resonator and an optical bandpass filter; a transmission periodic spectrum of the optical resonator is used as a wavelength ruler; a reflection spectrum of the optical bandpass filter is in a depression shape which can be a wavelength mark; an electronic temperature sensor is provided to obtain a precise temperature to calibrate the optical bandpass filter.

In the above optical MEMS based monitoring system, two or more fiber Bragg gratings with the separated peak or depression wavelengths function as the wavelength ruler.

In the above optical etalon, a fiber Bragg grating can replace the optical bandpass filter to provide a wavelength mark.

In the above optical MEMS based monitoring system, the optical etalon comprises two tips of two single mode optical fibers, a glass tube and a fiber Bragg grating; a transmission periodic spectrum or a reflection spectrum can be used as a wavelength ruler; and a transmission or reflection spectrum of a fiber Bragg grating is used as a wavelength mark.

In the above optical etalon, an electronic temperature sensor is provided in the optical etalon to obtain a precise temperature to calibrate any optical component to eliminate the thermal effect.

In the above optical MEMS based monitoring system, the TOF comprises two single mode collimators and an optical MEMS resonator; the optical MEMS resonator is formed by a MEMS membrane and a mirror; and the MEMS membrane is electrostatically or thermally tuned. The surface of the mirror is concave or flat.

In the above optical MEMS resonator of the TOF, the TOF comprises two single mode collimators and an optical MEMS resonator; and the optical MEMS resonator is formed by two MEMS membranes. One or two of the MEMS membranes can be electrostatically or thermally tuned.

In the above optical MEMS based monitoring system, the TOF comprises a single mode optical fiber and a MEMS membrane; the MEMS membrane is electrostatically or thermally tuned; and the optical MEMS resonator is formed by the tip of the single mode optical fiber and the MEMS membrane.

In the above optical MEMS resonator of the TOF, the single mode optical fiber can be replaced by a single mode lensed fiber.

In the above optical MEMS based monitoring system, an electronic temperature sensor is provided in the TOF to obtain a precise temperature to calibrate the TOF.

In the above optical MEMS based monitoring system, a mass is provided at the center of the MEMS membrane of the optical MEMS sensor, so that the optical MEMS sensor acts as an acceleration sensor.

In the above optical MEMS based monitoring system, the optical coupler can be replaced by optical circulator.

This application of the optical MEMS monitoring system adopts optical wavelength sensing. The peak or depression wavelength in the transmission, the reflection or the interference spectrum is employed as the sensing reference. The parameter to be monitored, such as the pressure, the temperature or the stress is a function of one specific peak or depression wavelength in the spectrum which is calibrated and concluded in advance. When the parameter to be monitored changes, the peak or depression wavelength changes, so that the system figures out the parameter according to the wavelength.

REFERENCE SIGNS IN THE DESCRIPTION
ARE AS FOLLOWS

1. Broadband light source; 2. TOF; 3. Optical etalon; 4. Optical receiver; 5. Optical coupler; 6. Optical MEMS sensor;
21. Single mode collimator;
31. Single mode optical dual fiber collimator; 32. Optical resonator; 33. Optical bandpass filter;
60. Optical MEMS resonator;
61. Pigtail optical MEMS sensor; 611. Single mode optical fiber; 6111. Tip;
62. Collimator optical MEMS sensor; 621. Single mode optical fiber collimator;
63. Isolated optical MEMS sensor; 631. Glass mirror; 632. Trigonometric reflector;
7. MEMS membrane;
8. Glass tube;
9. Tunable laser;
10. MEMS substrate.

DETAILED DESCRIPTION OF THE
PREFERRED EMBODIMENT

The preferred embodiments of the present disclosure are described in detail with reference to the accompanying drawings. It should be understood that the preferred embodiments described below are merely used to illustrate and explain the present disclosure, and not intended to limit the present disclosure.

Figure 1:
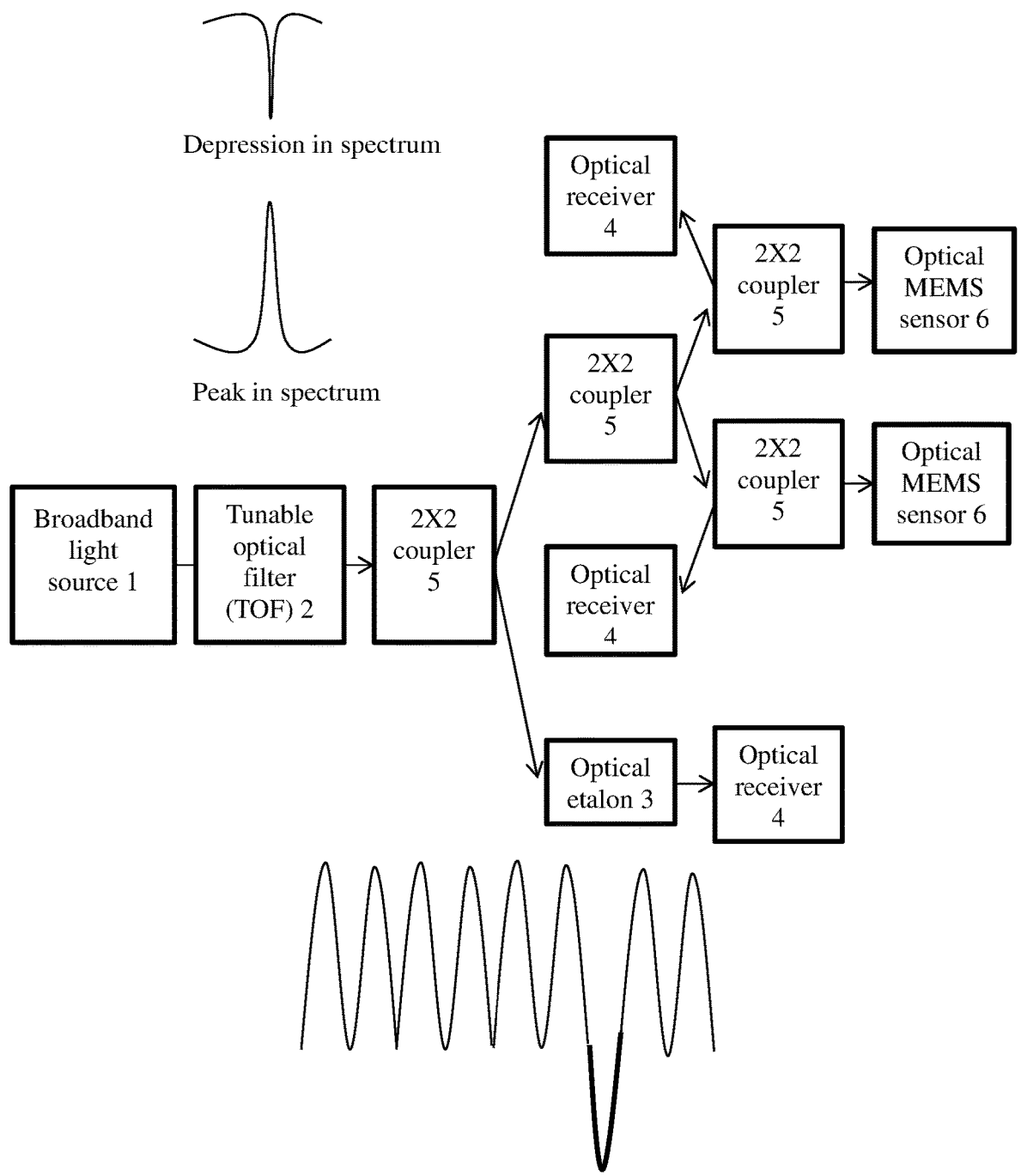
FIG. 1 is a schematic diagram of an optical MEMS based monitoring system with a broadband light source and a TOF according to an embodiment of the present application.

In an embodiment, as shown in FIG. 1, is a schematic diagram illustrating the structure of the optical MEMS monitoring system of the present application, which comprises a broadband light source 1, a TOF 2, an optical etalon 3, a plurality of optical receivers 4, a plurality of optical couplers 5, and a plurality of optical MEM sensors 6. The broadband light inputs a TOF 2 whose function is to scan the broadband light, then is separated into two paths by an optical coupler 5. One scanned broadband light hits two sensors and is reflected back to two optical receivers 4 with the help of a plurality of optical couplers 5. The peak or depression wavelength of the two reflection spectra of the two sensors can be captured. Another scanned broadband light hits the optical etalon 3 and is reflected back to an optical receiver 4 with the help of a plurality of optical couplers 5, so that the periodic spectrum with absolute wavelength mark as a ruler is received. By comparing the peak or depression wavelength with the ruler, the system can tell the exact wavelength. Accordingly, the parameter to be monitored is obtained.

Specifically, in the optical MEMS monitoring system, a broadband light transmitted along a single mode optical fiber 611 is first scanned by a TOF 2, then is separated into two paths. One goes to the optical MEMS sensor 6, so that the system can get the depression or the peak wavelength of the transmission, the reflection or the interference spectrum of the sensor. Another goes to an optical etalon 3, so that the periodic spectrum with absolute wavelength mark is obtained as a ruler. The peak or depression wavelength in the spectrum can be precisely figured out by comparing with the periodic spectrum of the etalon. Thereby, the parameter is sensed.

In an embodiment, the peak or depression wavelength is a function of the parameter to be monitored; and the function parameter is calibrated and concluded in advance, so that the system can monitor the parameter according to the absolute wavelength of the peak or depression wavelength. Besides, the sensors' thermal effect can also be eliminated by calibrating the sensors with temperature in advance.

Figure 2:
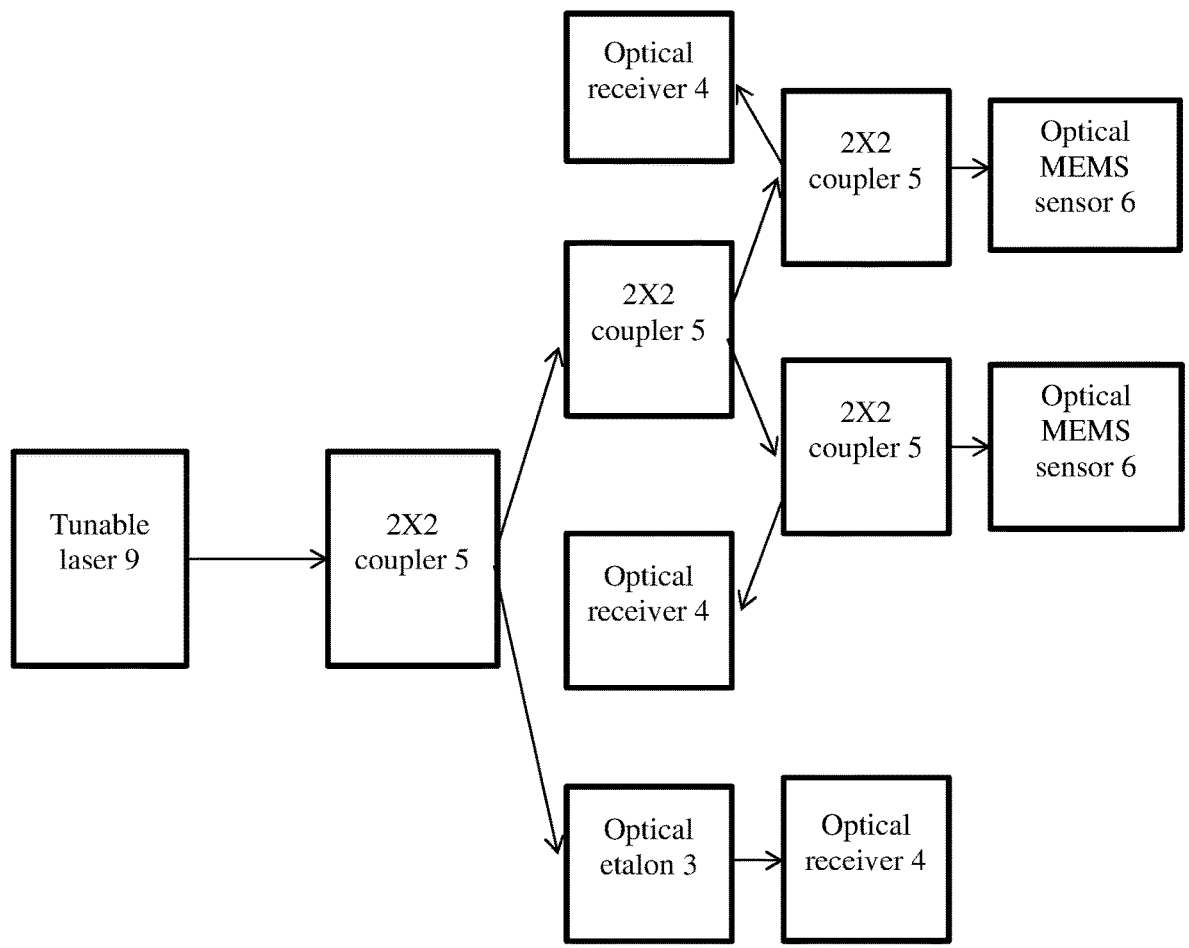
FIG. 2 is a schematic diagram of an optical MEMS based monitoring system with a tunable laser according to an embodiment of the present application.

In an embodiment, as shown in FIG. 2, is a schematic diagram illustrating the structure of the optical MEMS monitoring system provided by the present application, which comprises a tunable laser 9, a plurality of optical receivers 4, a plurality of optical couplers 5 and a plurality of sensors. The tunable laser 9 light is separated into two paths by an optical coupler 5. One is reflected from the two sensors and outputs to two optical receivers 4 with the help of a plurality of optical couplers 5, so the peak or depression wavelength of the reflection spectrum is captured. Another hits the optical etalon 3 and is reflected back to an optical receiver 4 with the help of a plurality of optical couplers 5, so that the periodic spectrum with absolute wavelength mark as a rule is received. By comparing the peak or depression wavelength with the ruler, the system can tell the exact wavelength. Accordingly, the parameter to be monitored is obtained.

Specifically, the function of a broadband light source 1 and a TOF 2 can be replaced by a tunable laser 9 which has a much higher optical power supporting a lot more sensors. The tunable laser 9 is formed by a TOF 2, an erbium-doped fiber amplifier, a pump laser and a few optical couplers 5.

Figure 3:
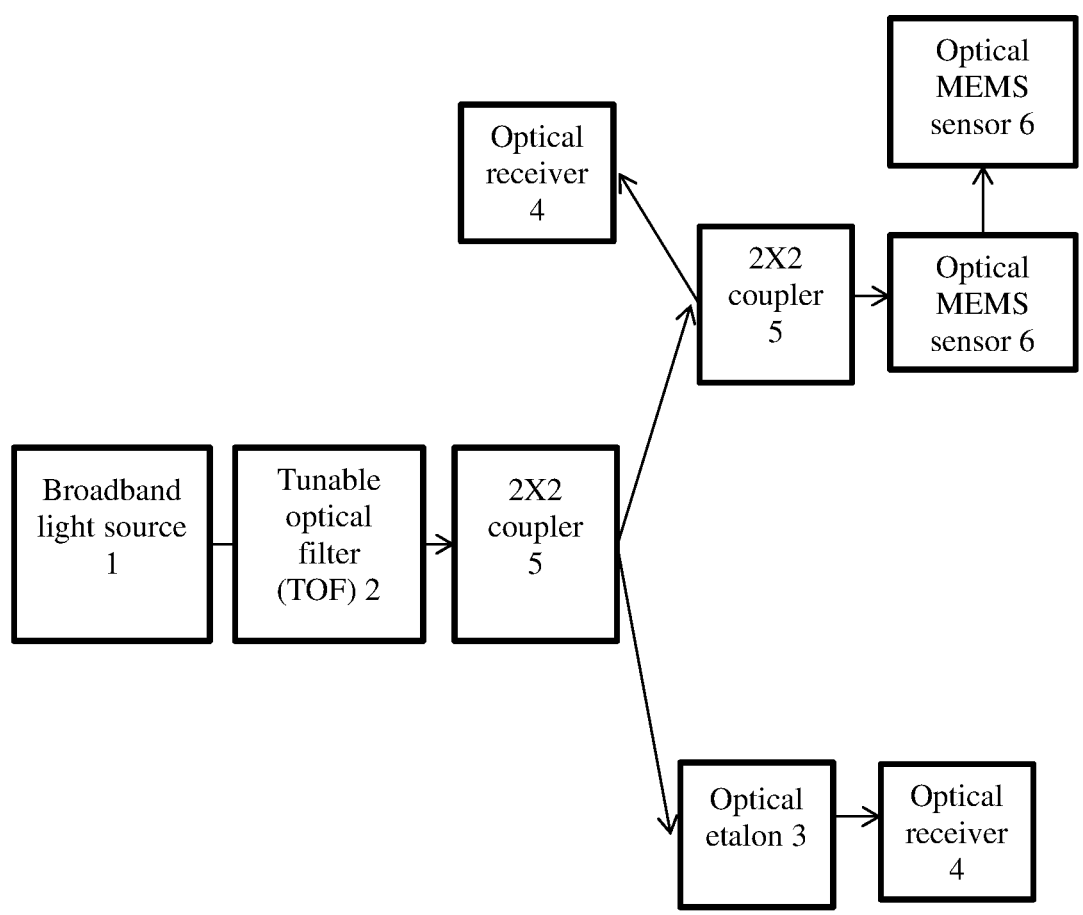
FIG. 3 is a schematic diagram of an optical MEMS based monitoring system with two optical MEMS sensors connected in series according to an embodiment of the present application.

In an embodiment, as shown in FIG. 3, is a schematic diagram illustrating the optical MEMS monitoring system with a plurality of optical MEMS sensors connected in series. As long as the peak or depression wavelength of each sensor is separated from each other, one single mode optical fiber 611 can support many sensors connected in series.

If many sensors are connected in one optical fiber, the peak or depression wavelengths of these sensors have to be separated in wavelength domain, so that they can work properly without interfering each other by wavelength multiplexing technology. The multiple sensors are connected to each other in series or parallel. The connections between the sensors and the system are either single mode optical fibers 611 or free space.

Furthermore, the optical MEMS sensor 6 in this application has the advantage of small size, easy production, low cost and excellent performance. The key element in the optical MEMS sensor 6 is the optical MEMS resonator 60 which has three structures depending on the applications, the pigtail optical MEMS sensor 61, the collimator optical MEMS sensor 62 and the isolated MEMS sensor 63.

The sensors, the etalon 3 and the TOF 2 in this application are introduced as below.

The Pigtail Optical MEMS Sensor 61

Figure 4:
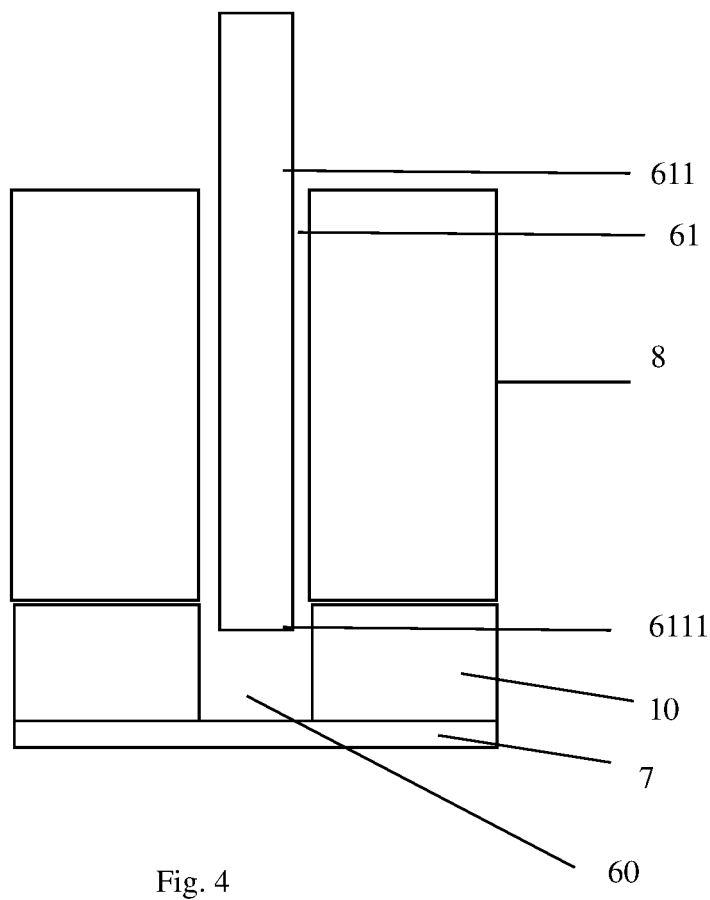
FIG. 4 is a cross sectional view of an optical pigtail MEMS sensor formed by a single mode optical fiber, a MEMS chip and a glass tube, according to an embodiment of the present application.

In an embodiment, as shown in FIG. 4, is a cross sectional view of an optical pigtail MEMS sensor, formed by a single mode optical fiber 611, a MEMS chip and a glass tube 8. The tip 6111 of the single mode optical fiber 611 acts as a mirror. The mirror and the membrane in the MEMS chip form an optical resonator 32. The glass tube 8 is applied to support the optical fiber and the MEMS chip. The polished fiber tip 6111 can be coated with the required reflection rate.

The pigtail optical MEMS sensor 61 is composed of a single mode optical fiber 611, a MEMS chip with a membrane, and a glass tube 8 which can be metal tube, ceramic tube, etc. The single mode optical fiber 611 is placed at one side of a glass tube 8, and the MEMS chip is placed at another side. The membrane of the MEMS chip is perpendicular to the axial direction of the tube. The three elements form an optical resonator 32. The shape of the membrane can be flat, concave or convex. The tip 6111 of the single mode optical fiber 611 can be coated with the required reflection rate. The membrane moves due to the pressure, the temperature or the stress, so that the peak or depression wavelength of the spectrum of the transmission, the reflection or the interference of the resonator changes. By monitoring the wavelength, the parameter to be monitored is obtained.

An alternative pigtail optical MEMS sensor 61 is composed of single mode optical fiber 611, a MEMS chip with two membranes and a glass tube 8 which can be metal tube, ceramic tube, etc. The single mode optical fiber 611 is placed at one side of a glass tube 8, and the MEMS chip is placed at another side. The two membranes of the MEMS chip form an optical resonator 32 which is perpendicular to the axial direction of the tube. The shape of one membrane of the two can be flat, concave or convex. The tip 6111 of the single mode optical fiber 611 can be coated the with required reflection rate. The membrane moves due to the pressure, the temperature or the stress, so that the peak or depression wavelength of the spectrum of the transmission, the reflection or the interference of the resonator changes. By monitoring the wavelength, the parameter to be monitored is obtained.

The Collimator Optical MEMS Sensor 62

Figure 5:
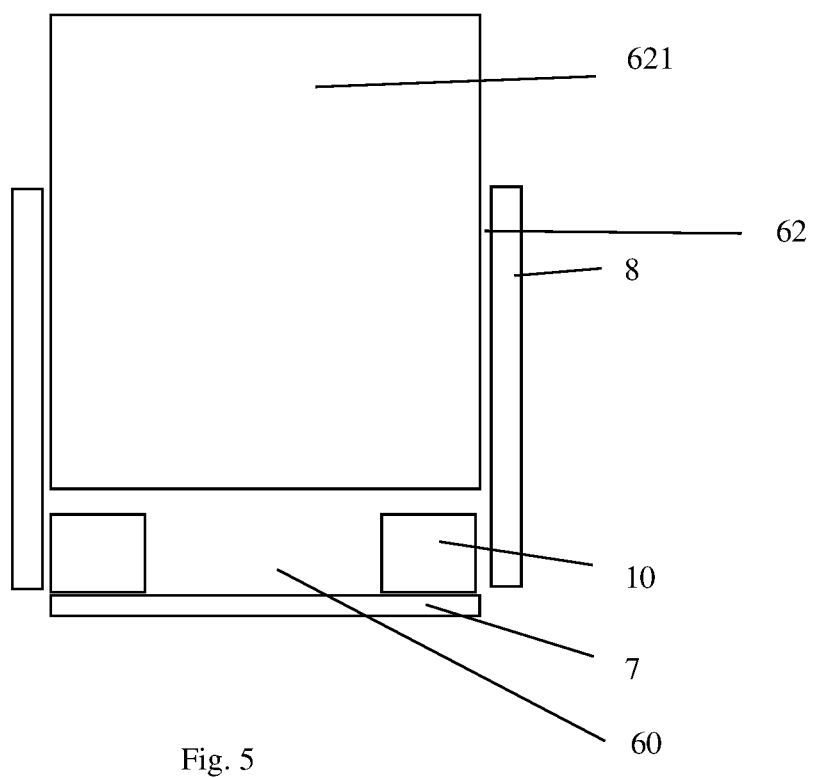
FIG. 5 is a cross sectional view of an optical collimator MEMS sensor formed by a single mode optical fiber collimator, a MEMS chip with one membrane and a glass tube, according to an embodiment of the present application.

In an embodiment, as shown in FIG. 5, is a cross sectional view of an optical collimator MEMS sensor, formed by a single mode optical fiber collimator 621 or a single mode optical dual fiber collimator 31, a MEMS chip with membrane and a glass tube 8. The outside plane of the lens of the collimator can be coated with the required reflection rate. The outside plane of the lens and the membrane in the MEMS chip form an optical resonator 32. The glass tube 8 support the collimator and the MEMS chip. The outside plane of the lens and the membrane can be either flat or concave.

The collimator optical MEMS sensor 62 is composed of a single mode optical fiber collimator 621 or a single mode optical dual fiber collimator 31, a MEMS chip with a membrane and a glass tube 8 which can be metal tube, ceramic tube, etc. The single mode optical fiber collimator 621 or the single mode optical dual fiber collimator 31, is placed at one side of a glass tube 8, and the MEMS chip is placed at another side. The membrane of the MEMS chip is perpendicular to the axial direction of the tube. The outside plane of the collimator, the MEMS membrane 7 which stands on the MEMS substrate 10, and the glass tube 8 form an optical resonator 32. The shape of the membrane can be flat, concave or convex, depending on the application. The outside plane of the collimator can be coated with the required reflection rate. The membrane moves due to the pressure, the temperature or the stress, so that the peak or depression wavelength of the spectrum of the transmission, the reflection or the interference of the resonator changes. By monitoring the wavelength, the parameter to be monitored is obtained.

Figure 6:
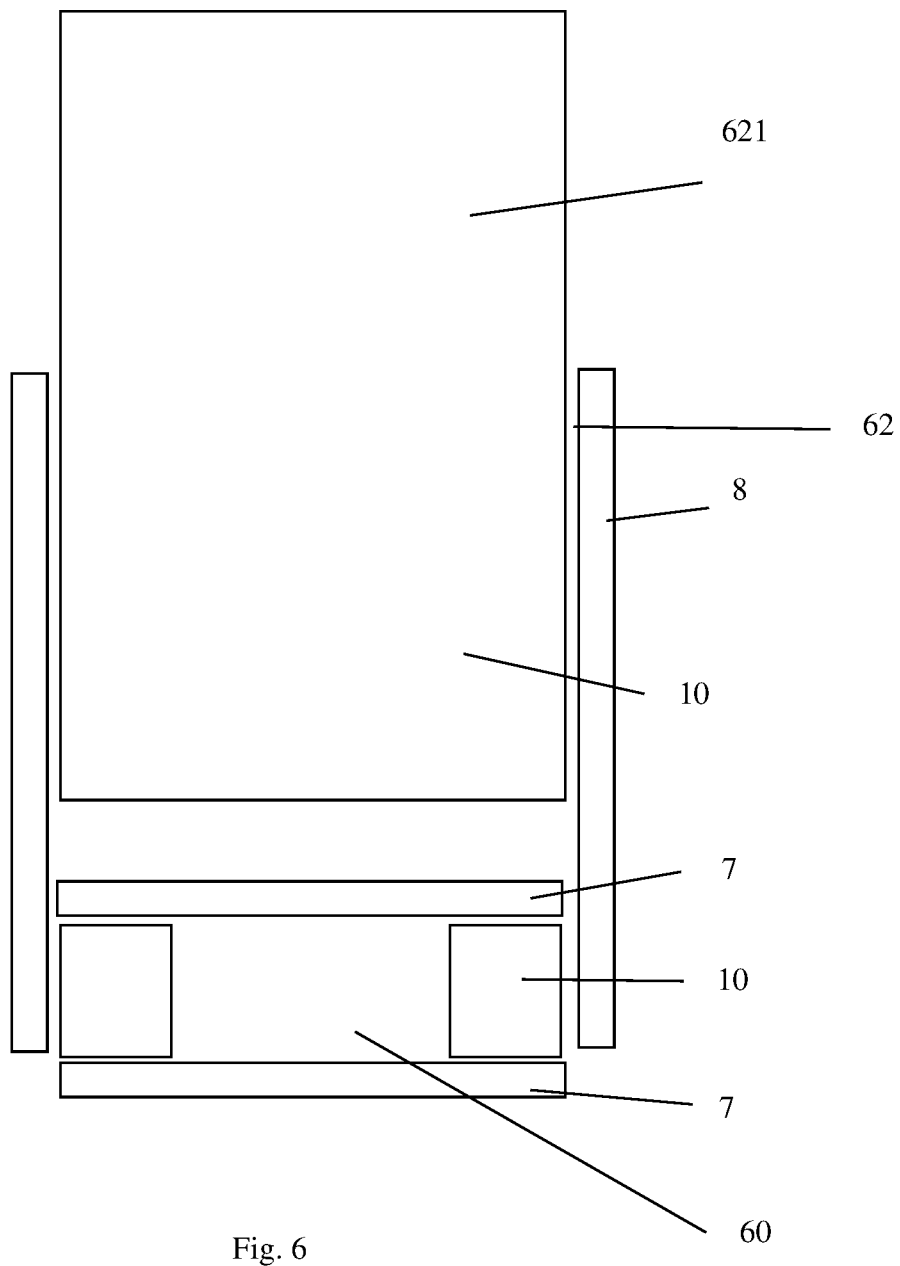
FIG. 6 is a cross sectional view of an optical collimator MEMS sensor formed by a single mode optical fiber collimator, a MEMS chip with two membranes and a glass tube, according to another embodiment of the present application.

In an embodiment, as shown in FIG. 6, is a cross sectional view of an alternative collimator optical MEMS sensor 62, formed by a single mode optical fiber collimator 621, a MEMS chip and a glass tube 8. The MEMS chip has two membranes, which form the optical resonator 32. The two membranes of the MEMS chip are perpendicular to the axial direction of the tube. The shape of the two membranes can be flat, concave or convex, depending on the application. The glass tube 8 is applied as a substrate to fix the collimator and the MEMS chip. The membrane moves due to the pressure, the temperature or the stress, so that the peak or depression wavelength of the spectrum of the transmission, the reflection or the interference of the resonator changes. By monitoring the wavelength, the parameter to be monitored is obtained.

In an embodiment, another alternative collimator optical MEMS sensor 62 is composed of a single mode optical dual fiber collimator 31, a MEMS chip with two membranes and a glass tube 8 which can be metal tube, ceramic tube, etc. The single mode optical dual fiber collimator 31 is placed at one side of a glass tube 8, and the MEMS chip is placed at another side. The two membranes of the MEMS chip are perpendicular to the axial direction of the tube. The two membranes of the MEMS chip form an optical resonator 32. The shape of the membrane can be flat, concave or convex, depending on the application. The membrane moves due to the pressure, the temperature or the stress, so that the peak or depression wavelength of the spectrum of the transmission, the reflection or the interference of the resonator changes. By monitoring the wavelength, the parameter to be monitored is obtained.

In the above three structures of the collimator optical MEMS sensor 62, if the MEMS chip is fabricated with a tube-liked substrate, the glass tube 8 can be eliminated.

The Isolated Optical MEMS Sensor 63

Figure 7:
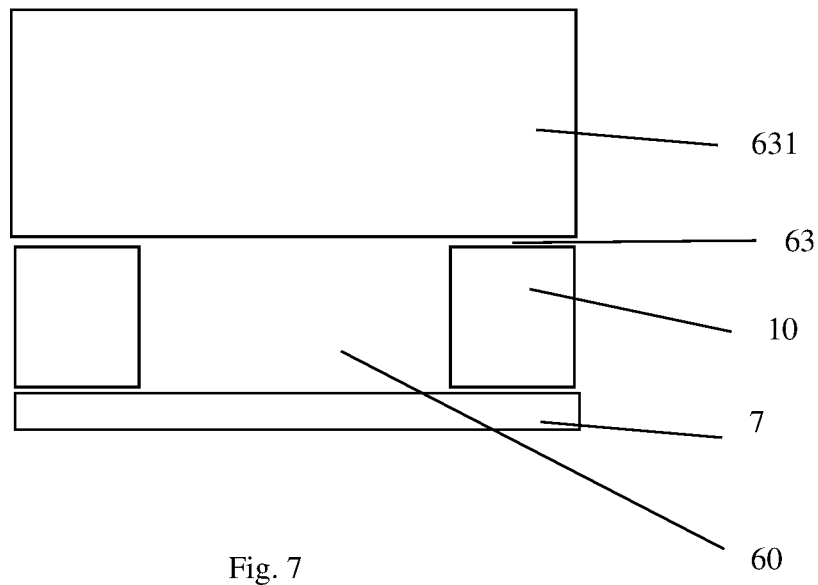
FIG. 7 is a cross sectional view of a sensor formed by an isolated MEMS with one membrane and one mirror, according to an embodiment of the present application.

In an embodiment, as shown in FIG. 7, is a cross sectional view of an optical isolated MEMS sensor, formed by an isolated MEMS with one membrane and one glass mirror 631. The glass mirror 631 and the membrane in the MEMS chip form an optical resonator 32. A light beam inputs this sensor through free space. The glass mirror 631 and the membrane can be either flat or concave.

The isolated optical MEMS sensor 63 is composed of a MEMS chip with a membrane and an optical glass mirror 631 which form an optical resonator 32. The shape of the membrane can be flat, concave or convex. The isolated MEMS is normally placed in a sealed environment or harsh environment without any wire connected. A single mode optical fiber collimator 621 or a single mode optical dual fiber collimator 31 is applied to couple the light beam to the sensor. The membrane moves due to the pressure, the temperature or the stress, so that the peak or depression wavelength of the spectrum of the transmission, the reflection or the interference of the resonator changes. By monitoring the wavelength, the parameter to be monitored is obtained.

Figure 8:
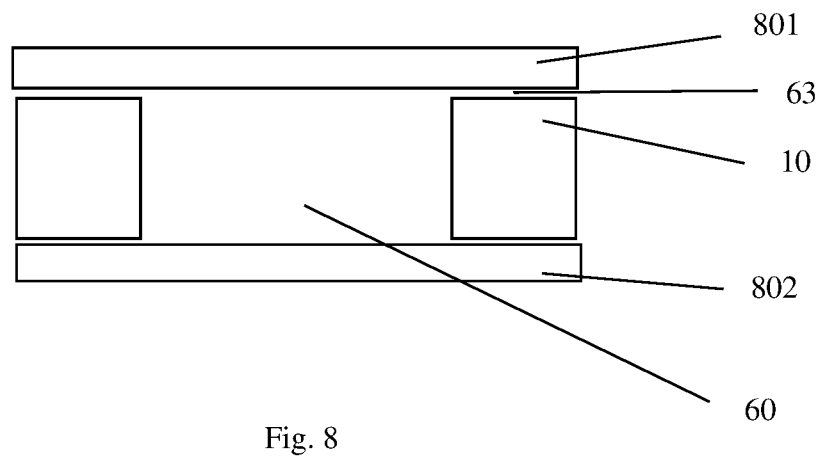
FIG. 8 is a cross sectional view of a sensor formed by an isolated MEMS with two membranes, according to another embodiment of the present application.

In an embodiment, as shown in FIG. 8, is a cross sectional view of an alternative isolated optical MEMS sensor 63, formed by an isolated MEMS with two membranes. The two membranes in the MEMS chip form an optical resonator 32. A light beam inputs this sensor through free space. The two membranes 801, 802 can be either flat or concave.

The alternative isolated optical MEMS sensor 63 consists of a MEMS chip with two membranes which can form an optical resonator 32. A single mode optical fiber collimator 621 or a single mode optical dual fiber collimator 31 is applied to couple the light beam to the sensor from far way. The membrane moves due to the pressure, the temperature or the stress, so that the peak or depression wavelength of the spectrum of the transmission, the reflection or the interference of the resonator changes. By monitoring the wavelength, the parameter to be monitored is obtained.

Figure 9:
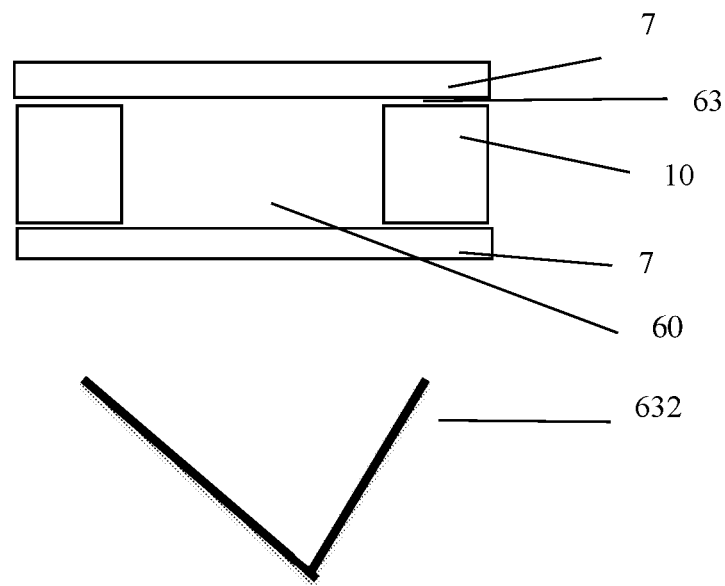
FIG. 9 is a cross sectional view of a sensor formed by an isolated MEMS and a trigonometric reflector, according to another embodiment of the present application.

In an embodiment, as shown in FIG. 9, is a cross sectional view of another alternative sensor, formed by an optical isolated MEMS resonator and trigonometric reflector 632. The two membranes in the MEMS chip form an optical resonator 32. A light beam inputs this sensor through free space. A trigonometric reflector 632 is placed behind the optical MEMS resonator 60, so that the light beam hits the trigonometric reflector 632 and is reflected back. The transmission spectrum with peak or depression wavelength of this MEMS based resonator can represent the parameter to be monitored.

Another alternative isolated optical MEMS sensor 63 is the sensor introduced above combined with a trigonometric reflector 632. One single mode optical fiber collimator 621 sends the light to the isolated optical MEMS resonator 60, hits the trigonometric reflector 632, is reflected back to the isolated optical MEMS resonator 60, and returns to another single mode fiber collimator. The light beam passes the isolated optical MEMS resonator 60 twice to form a transmission spectrum. The system figures out the peak or the depression in the transmission spectrum, so that the parameter is monitored accordingly. By applying a Faraday rotator, the orientation of polarization is rotated 90 degrees, so that the reflected light beam walks away from the input optical path and is received by a photoelectric receiver.

The Innovative Optical Etalon 3

Figure 10:
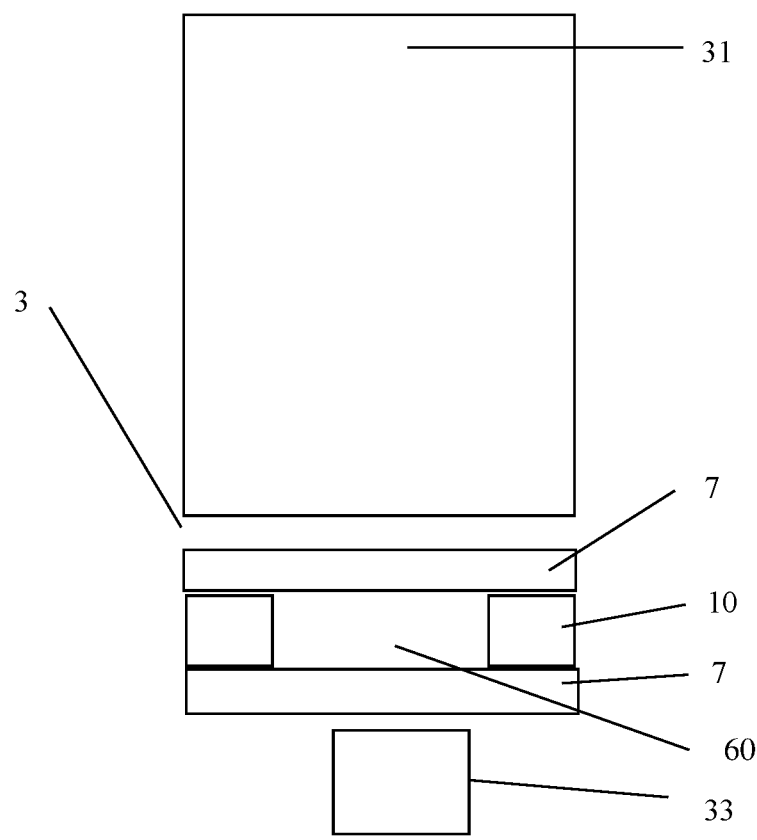
FIG. 10 is a cross sectional view of an optical etalon formed by a single mode optical dual fiber collimator, an optical resonator and a bandpass filter, according to an embodiment of the present application.

In an embodiment, as shown in FIG. 10, is a cross sectional view of an optical etalon 3, formed by a single mode optical dual fiber collimator 31, an optical resonator 32 and a bandpass filter. The single mode optical dual fiber collimator 31 induces the light. The light passes the resonator, hits the bandpass filter, is reflected back, passes the resonator again and goes back to the single mode optical dual fiber collimator 31. The transmission spectrum of the resonator is a periodic spectrum applied as a wavelength ruler. The reflection spectrum of the bandpass filter is a depression shape to achieve an absolute wavelength mark.

One of the key components in the optical MEMS monitoring system is the optical etalon 3. The innovative etalon of the present application is formed by a single mode optical dual fiber collimator 31, an optical resonator 32 and an optical bandpass filter 33 in order to employ the reflection spectrum of the bandpass filter as a mark and the transmission periodic spectrum of the optical resonator 32 as a ruler. The reflection spectrum of the optical bandpass filter 33 gives the periodic spectrum a depression mark.

Alternatively, in an embodiment, a fiber Bragg grating is provided as a sensor to connect the optical MEMS sensors 6 by series or parallel.

The etalon is formed by a single mode optical dual fiber collimator 31, an optical resonator 32, a fiber Bragg grating and an electronic temperature sensor as temperature standard. The fiber Bragg grating is connected with a single mode optical dual fiber collimator 31, whose transmission spectrum gives the periodic etalon's spectrum a depression mark. The electronic temperature sensor is applied to calibrate the drift of the fiber Bragg grating or the etalon with temperature.

Alternatively, in an embodiment, two or more fiber Bragg gratings with separated peak or depression wavelengths function as the wavelength ruler.

Two or more fiber Bragg gratings are used as a wavelength ruler. The packaging of the fiber Bragg grating should not involve any stress which may affect the peak wavelength of the fiber Bragg grating. The electronic temperature sensor is applied to calibrate the drift of the fiber Bragg grating with temperature.

Alternatively, the periodic spectrum is achieved by an optical resonator 32 composed of two tips 6111 of two single mode optical fibers 611. Either the transmission spectrum or the reflection spectrum is used as a ruler. The electronic temperature sensor is applied to calibrate the drift of the fiber Bragg grating or the etalon with temperature.

The Optical MEMS TOF 2

Figure 11:
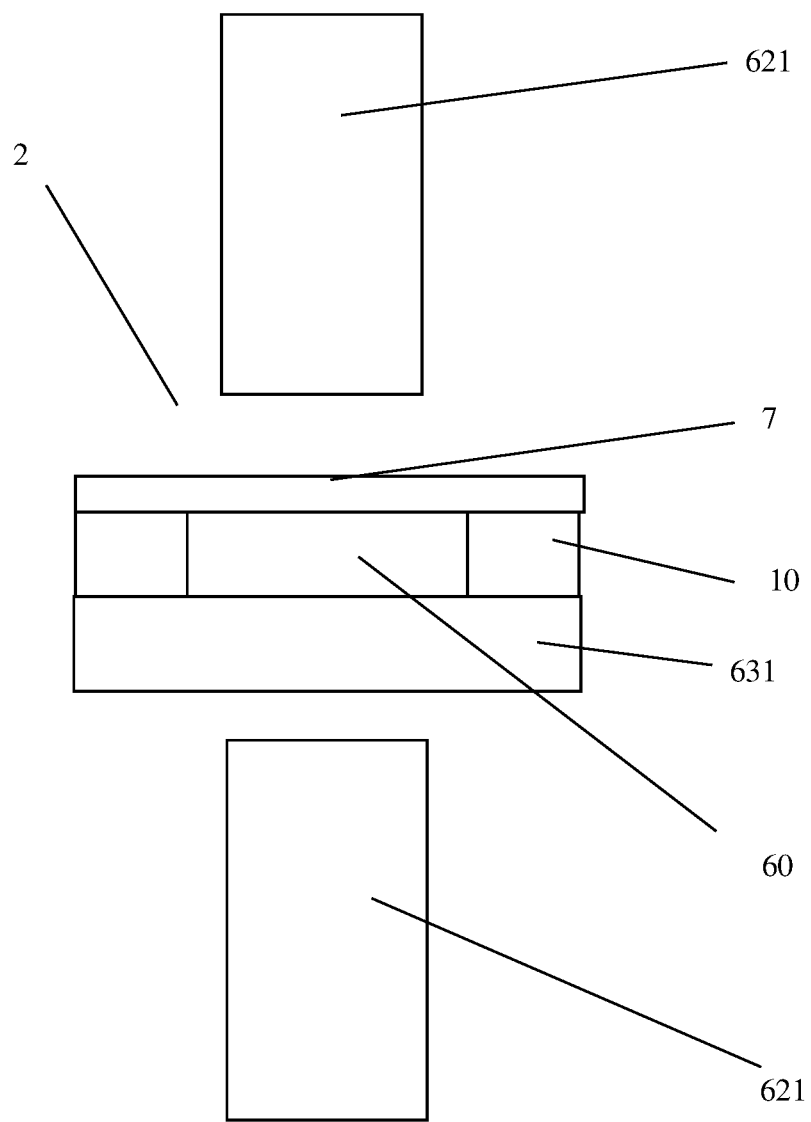
FIG. 11 is a cross sectional view of a TOF formed by two single mode optical fiber collimators, a MEMS membrane which stands on a MEMS substrate and a concave or flat mirror, according to an embodiment of the present application.

In an embodiment, as shown in FIG. 11, is a cross sectional view of a TOF 2, formed by two single mode optical fiber collimators 621, a MEMS chip formed by MEMS membrane 7 and a glass mirror 631. The optical MEMS resonator 60 is formed by the glass mirror 631 and MEMS membrane 7. The single mode optical fiber collimator 621 induces the light, passes the optical MEMS resonator 60 and outputs to another single mode optical fiber collimator 621. The glass mirror 631 and the MEMS membrane 7 can be either flat or concave.

One of the key components in the optical MEMS monitoring system is a TOF 2. The innovative TOF 2 in this application is formed by two single mode optical fiber collimators 621 and an optical MEMS resonator 60. The optical MEMS resonator 60 is formed by a concave or flat mirror and a concave or flat MEMS membrane 7 which can be tuned electrostatically or thermally. A single mode optical fiber collimator 621 induces the light to the optical MEMS resonator 60 and outputs to another single mode optical fiber collimator 621.

Alternatively, the TOF 2 can be formed by a single mode optical dual fiber collimator 31, an optical MEMS resonator 60 and an optical reflector. The light from one single mode optical fiber 611 of single mode optical dual fiber collimator 31 inputs the optical MEMS resonator 60, hits the optical reflector behind the MEMS resonator, is reflected back, inputs the optical MEMS resonator 60 again and outputs to another single mode optical fiber 611 of the single mode optical dual fiber collimator 31.

Alternatively, the optical MEMS resonator 60 in the TOF 2 is formed by two membranes. One or two membranes can be concave or flat shape.

Alternatively, the TOF 2 can be formed by a concave or flat MEMS membrane 7 and the tip 6111 of a single mode optical fiber 611.

A tunable laser 9 is formed by a TOF 2 in this application, an erbium-doped fiber amplifier, a pump laser and a few optical couplers 5.

The above description is only for specific embodiments of the disclosure, not intended to limit the present disclosure, and those skilled in the art can make various modifications according to the principles of the present disclosure. Therefore, any modifications made in accordance with the principles of the present disclosure shall be understood as falling within the scope of protection of the present disclosure.

What is claimed is:

1. An optical micro-electro-mechanical system (MEMS) based monitoring system, comprising: a broadband light source, a tunable optical filter (TOF), an optical etalon, a plurality of optical receivers, a plurality of optical couplers, and a plurality of optical MEMS sensors; wherein the TOF is configured to pass light for generating a spectrum of the optical MEMS sensor, and the spectrum is selected from one of a transmission spectrum, a reflection spectrum and an interference spectrum; wherein a peak or depression wavelength in a spectrum corresponds to a parameter to be monitored of a pressure, a temperature or a stress; and the peak or depression wavelength can be obtained by comparing the spectrum with a periodic spectrum of the optical etalon, and the optical etalon has an absolute wavelength mark; wherein the optical MEMS sensor comprises an optical MEMS resonator; and the optical MEMS sensor is an optical pigtail MEMS sensor, comprising a single mode optical fiber, a MEMS membrane and a glass tube; the optical MEMS resonator is formed by a tip of the single mode optical fiber and the MEMS membrane; the glass tube is configured to support the single mode optical fiber and the MEMS membrane; wherein a cavity of the optical MEMS resonator is sealed or provided with an air hole.

2. The optical MEMS based monitoring system of claim 1 wherein: the peak or depression wavelength is a preset function of the parameter to be monitored, so that the system can monitor the parameter according to the absolute wavelength mark of the peak or depression wavelength.

3. The optical MEMS based monitoring system of claim 1 wherein: the combination of the broadband light source and the TOF can be replaced by a tunable laser, configured for wavelength scanning.

4. The optical MEMS based monitoring system of claim 1 wherein: the optical MEMS sensor is an optical collimator MEMS sensor, comprising a single mode optical fiber collimator, a MEMS membrane and a glass tube; the optical MEMS resonator is formed by a lens plane of the single mode optical fiber collimator and the MEMS membrane; the glass tube is configured to support the single mode optical fiber collimator and the MEMS membrane; wherein the cavity of the optical MEMS resonator is sealed or provided with an air hole.

5. The optical MEMS based monitoring system of claim 4 wherein: the single mode optical fiber collimator can be replaced by a single mode optical dual fiber collimator.

6. The optical MEMS based monitoring system of claim 4 wherein: the single mode optical fiber collimator can be replaced by a single mode optical lensed fiber.

7. The optical MEMS based monitoring system of claim 1 wherein: the optical MEMS sensor is an optical isolated MEMS sensor, comprising a glass mirror, a MEMS membrane and a glass tube; the optical MEMS resonator is formed by the glass mirror and the MEMS membrane; the glass tube is configured to support the glass mirror and the MEMS membrane; wherein the cavity of the optical MEMS resonator is sealed or provided with an air hole.

8. The optical MEMS based monitoring system of claim 7 wherein: the isolated optical MEMS sensor further comprises a trigonometric reflector, the trigonometric reflector is configured to reflect an input light beam back, so that the input light beam passes the optical MEMS resonator twice.

9. The optical MEMS based monitoring system of claim 1 wherein: two MEMS membranes are employed to form the optical MEMS resonator of the MEMS sensors.

10. The optical MEMS based monitoring system of claim 1 wherein: the optical etalon comprises a single mode optical dual fiber collimator, an optical resonator and an optical bandpass filter; a transmission periodic spectrum of the optical resonator is used as a wavelength ruler; a reflection periodic spectrum of the optical bandpass filter is in a depression shape; and an electronic temperature sensor is provided to obtain a precise temperature to calibrate the optical bandpass filter.

11. The optical MEMS based monitoring system of claim 10 wherein: a fiber Bragg grating can replace the optical bandpass filter to provide a wavelength mark.

12. The optical MEMS based monitoring system of claim 1 wherein: the optical etalon comprises two tips of two single mode optical fibers, a glass tube, and a fiber Bragg grating for providing a wavelength mark.

13. The optical MEMS based monitoring system of claim 1 wherein: the TOF comprises two single mode collimators and an optical MEMS resonator; the optical MEMS resonator of the TOF is formed by a MEMS membrane and glass mirror; the MEMS membrane is electrostatically or thermally tuned; wherein the plane of the glass mirror can be flat or concave.

14. The optical MEMS based monitoring system of claim 13 wherein: the optical MEMS resonator in the TOF is formed by two MEMS membranes, each of which can be electrostatically or thermally tuned; wherein the shape of the membrane can be flat or concave.

15. The optical MEMS based monitoring system of claim 1 wherein: the TOF comprises a single mode optical fiber and a MEMS membrane; the MEMS membrane is electrostatically or thermally tuned; the optical MEMS resonator is formed by the tip of the single mode optical fiber and the MEMS membrane; wherein the shape of the membrane can be flat or concave.

16. The optical MEMS based monitoring system of claim 1 wherein: the optical coupler can be replaced by an optical circulator.

* * * * *